(12) United States Patent
Reed et al.

(10) Patent No.: US 10,370,740 B2
(45) Date of Patent: Aug. 6, 2019

(54) NICKEL-BASED ALLOY

(71) Applicant: OXFORD UNIVERSITY INNOVATION LIMITED, Oxford Oxfordshire (GB)

(72) Inventors: Roger Reed, Oxford Oxfordshire (GB); Zailing Zhu, Oxford Oxfordshire (GB); David Crudden, Oxford Oxfordshire (GB)

(73) Assignee: Oxford University Innovation Limited, Oxford (GB)

( * ) Notice: Subject to any disclaimer, the term of this patent is extended or adjusted under 35 U.S.C. 154(b) by 0 days.

(21) Appl. No.: 15/741,700

(22) PCT Filed: Jun. 30, 2016

(86) PCT No.: PCT/GB2016/051985
§ 371 (c)(1),
(2) Date: Jan. 3, 2018

(87) PCT Pub. No.: WO2017/006089
PCT Pub. Date: Jan. 12, 2017

(65) Prior Publication Data
US 2018/0195156 A1   Jul. 12, 2018

(30) Foreign Application Priority Data

Jul. 3, 2015   (GB) .................................. 1511698.1

(51) Int. Cl.
*C22C 19/05* (2006.01)
*C30B 29/02* (2006.01)

(52) U.S. Cl.
CPC ............ *C22C 19/056* (2013.01); *C22C 19/05* (2013.01); *C30B 29/02* (2013.01)

(58) Field of Classification Search
CPC .................................. C22C 19/056; C22F 1/10
See application file for complete search history.

(56) References Cited

U.S. PATENT DOCUMENTS

| | | | |
|---|---|---|---|
| 4,013,424 A | 3/1977 | Wildgoose et al. | |
| 4,209,348 A | 6/1980 | Duhl et al. | |
| 4,719,080 A | 1/1988 | Duhl et al. | |
| 5,035,958 A | 7/1991 | Jackson et al. | |
| 5,540,790 A | 7/1996 | Erickson | |
| 6,054,096 A | 4/2000 | Duhl et al. | |
| 2002/0041821 A1 | 4/2002 | Manning et al. | |
| 2014/0119979 A1 | 5/2014 | Zhang et al. | |

FOREIGN PATENT DOCUMENTS

| | | |
|---|---|---|
| CN | 106191529 | 12/1916 |
| CN | 87102590 | 10/1987 |
| CN | 1110993 | 11/1995 |
| CN | 101528959 | 9/2009 |
| CN | 102031419 | 4/2011 |
| EP | 0789087 | 8/1997 |
| EP | 1382697 | 1/2004 |
| EP | 1642989 | 4/2006 |
| EP | 1790744 | 5/2007 |
| EP | 1801251 | 6/2007 |
| EP | 2562277 | 2/2013 |
| EP | 2805784 | 11/2014 |
| GB | 2268937 | 1/1994 |
| JP | H07-300639 | 11/1995 |
| JP | H10-46277 | 2/1998 |
| WO | WO 2002/070764 | 9/2002 |
| WO | WO 2009/023090 | 2/2009 |

OTHER PUBLICATIONS

International Search Report and Written Opinion issued in International Application No. PCT/GB2016/0515985, dated Sep. 2, 2016.
Office Action issued in Corresponding Chinese Patent Application No. 201680037529, dated May 17, 2019. (English Translation).

*Primary Examiner* — Jessee R Roe
(74) *Attorney, Agent, or Firm* — Norton Rose Fulbright US LLP

(57) ABSTRACT

A nickel-based alloy composition consisting, in weight percent, of: between 12.3 and 15.2% chromium, between 4.8 and 12.0% cobalt, between 2.5 and 8.3% tungsten, between 0.0 and 0.5% molybdenum, between 0.0 and 0.5% rhenium, between 3.5 and 6.7% aluminium, between 6.1 and 10.7% tantalum, between 0.0 and up to 0.5% hafnium, between 0.0 and 0.5% niobium, between 0.0 and 0.5% titanium, between 0.0 and 0.5% vanadium, between 0.0 and 0.1% silicon, between 0.0 and 0.1% yttrium, between 0.0 and 0.1% lanthanum, between 0.0 and 0.1% cerium, between 0.0 and 0.003% sulphur, between 0.0 and 0.05% manganese, between 0.0 and 0.05% zirconium, between 0.0 and 0.005% boron, between 0.0 and 0.01% carbon, the balance being nickel and incidental impurities.

20 Claims, 13 Drawing Sheets

NICKEL-BASED ALLOY

CROSS-REFERENCE TO RELATED APPLICATION

This application is a national phase application under 35 U.S.C. § 371 of International Patent Application No. PCT/GB2016/051985 filed Jun. 30, 2016, which claims priority to Great Britain Patent Application No. GB1511698.1, filed Jul. 3, 2015. The entire contents of the referenced applications are incorporated into the present application by reference.

The present invention relates to a nickel-based single crystal superalloy composition for use within industrial gas turbines (IGT). Previously, there has been a tendency to migrate nickel-based superalloys proven on aeroengines to IGT applications. However, this has proven largely inappropriate probably because the necessary design intent—determined from factors such as engine architecture and usage—is then not respected. The present invention provides an alloy designed to have creep resistance comparable to equivalent alloy grades along with significant improvements in corrosion resistance. The alloy is also of a relatively low cost which is particularly advantageous for applications where relatively large castings are required. The balance of properties for the new alloy make it suitable for IGT applications where fuels of lesser quality than aeroengine applications lead to aggressive corrosion damage.

Examples of typical compositions of nickel-based single crystal superalloys which are used in IGTs are listed in Table 1. These alloys may be used for the manufacture of rotating/stationary turbine blades used in gas turbine engines.

TABLE 1

Nominal composition in wt. % of commercially used single crystal alloys used for IGT applications.

| Name | Al | Cr | Co | Mo | W | Ti | Ta | Nb | V | Hf |
|---|---|---|---|---|---|---|---|---|---|---|
| Nasair100 | 5.80 | 9.00 | — | 1.00 | 10.50 | 1.20 | 3.30 | — | — | — |
| CMSX-2 | 5.60 | 8.00 | 4.60 | 0.60 | 8.00 | 1.00 | 6.00 | — | — | — |
| CMSX-6 | 4.80 | 9.80 | 5.00 | 3.00 | — | 4.70 | 2.00 | — | — | 0.10 |
| PWA1480 | 5.00 | 10.00 | 5.00 | — | 4.00 | 1.50 | 12.00 | — | — | — |
| SRR99 | 5.50 | 8.00 | 5.00 | — | 10.00 | 2.20 | 3.00 | — | — | — |
| RR2000 | 5.50 | 10.00 | 15.00 | 3.00 | — | 4.00 | — | — | 1.00 | — |
| ReneN4 | 3.70 | 9.00 | 8.00 | 2.00 | 6.00 | 4.20 | 4.00 | 0.50 | — | — |
| AM1 | 5.20 | 7.80 | 6.50 | 2.00 | 5.70 | 1.10 | 7.90 | — | — | — |
| AM3 | 6.00 | 8.00 | 5.50 | 2.30 | 5.00 | 2.00 | 3.50 | — | — | — |
| TMS-6 | 5.30 | 9.20 | — | — | 8.70 | — | 10.40 | — | — | — |
| TMS-12 | 5.20 | 6.60 | — | — | 12.80 | — | 7.70 | — | — | — |
| PWA1483 | 3.60 | 12.20 | 9.20 | 1.90 | 3.80 | 4.20 | 5.00 | — | — | — |
| MC2 | 5.00 | 8.00 | 5.00 | 2.00 | 8.00 | 1.50 | 6.00 | — | — | — |

These materials are used within the hottest section of a gas turbine engine because of their outstanding resistance to mechanical and chemical degradation. They contain as many as ten different alloying elements, necessary to confer the desired combination of properties.

It is an aim of the invention to provide a nickel-based alloy for use in IGT applications which has mechanical properties equivalent to other alloys used for these applications combined with improved resistance to corrosion damage.

It is an aim of the invention is to provide an alloy which is also of equivalent and or lower cost to those alloys listed in Table 1.

The present invention provides a nickel-based alloy composition consisting, in weight percent, of: between 12.3 and 15.2% chromium, between 4.8 and 12.0% cobalt, between 2.5 and 8.3% tungsten, between 0.0 and 0.5% molybdenum, between 0.0 and 0.5% rhenium, between 3.5 and 6.7% aluminium, between 6.1 and 10.7% tantalum, between 0.0 and up to 0.5% hafnium, between 0.0 and 0.5% niobium, between 0.0 and 0.5% titanium, between 0.0 and 0.5% vanadium, between 0.0 and 0.1% silicon, between 0.0 and 0.1% yttrium, between 0.0 and 0.1% lanthanum, between 0.0 and 0.1% cerium, between 0.0 and 0.003% sulphur, between 0.0 and 0.05% manganese, between 0.0 and 0.05% zirconium, between 0.0 and 0.005% boron, between 0.0 and 0.01% carbon, the balance being nickel and incidental impurities. This composition provides a good balance between cost, density, creep strength and oxidation resistance.

In an embodiment, the nickel-based alloy composition consists, in weight percent, of between 12.3 and 14.7% chromium, preferably between 13.0 and 14.7% chromium. Such an alloy is particularly resistant to oxidation damage whilst remaining substantially free from deleterious TCP phase formation.

In an embodiment, the nickel-based alloy composition consists, in weight percent, of between 7.1 and 11.0% cobalt, preferably of more than 7.8 wt. %. Such an alloy is particularly resistant to creep deformation with a limited level of creep anisotropy (orientation dependence) being observed.

In an embodiment, the nickel-based alloy composition consists, in weight percent of, between 3.3 and 6.4% tungsten, preferably between 4.2 and 5.8% tungsten. This composition strikes a compromise between low weight, resistance to TCP phase formation and creep resistance.

In an embodiment, the nickel-based alloy composition consists, in weight percent, of between 4.5 and 6.4% aluminium, preferably between 4.7 and 5.7% aluminium. This composition achieves high creep resistance and reduced density alongside increased oxidation resistance.

In an embodiment, the nickel-based alloy composition consists, in weight percent, of between 6.1 and 10.7% tantalum. This provides the best balance between creep resistance and density and/or prevents the possibility of formation of the Eta ($\varepsilon$) phase $Ni_3Ta$. Preferably the alloy consists of between 6.5 and 10.7% tantalum, more preferably between 6.6 and 9.4% tantalum. This reduces the cost and density of the alloy further as well as the propensity for $\varepsilon$ phase formation.

In an embodiment, the nickel-based alloy composition consists, in weight percent, of between 0.0 and 0.2% hafnium. This is optimum for tying up incidental impurities in the alloy, for example, carbon.

In an embodiment, in the nickel-based alloy composition, the sum of the elements cobalt and tungsten, in weight percent, is greater than 13.5%. Such an alloy has superior creep resistance.

In an embodiment, in the nickel-based alloy composition, the sum of the elements tungsten and tantalum, in weight percent, is less than 14.4%, preferably is less than 12.6%. This is advantageous as such an alloy has a comparatively lower density.

In an embodiment, the nickel-based alloy composition has between 50 and 65% volume fraction γ', preferably a volume fraction of γ' between 50-60%, more preferably a volume fraction of γ' between 50-55%. This provides the preferred balance between creep resistance, oxidation resistance and propensity to formation of TCP phases.

In an embodiment, in the nickel-based alloy composition, the sum of the elements aluminium and tantalum, in weight percent, is between 11.5 and 16.2%, preferably between 11.5 and 15.8%, more preferably between 11.5 and 15.5%. This helps achieve the desired volume fraction of γ'.

In an embodiment, the nickel-based alloy composition is such that the following equation is satisfied in which $W_{Ta}$ and $W_{Al}$ are the weight percent of tantalum and aluminium in the alloy respectively $33 \leq W_{Ta}+5.2\ W_{Al} \leq 45$; preferably $33 \leq W_{Ta}+5.2\ W_{Al} \leq 41$; more preferably $33 \leq W_{Ta}+5.2\ W_{Al} \leq 39$; most preferably $33 \leq W_{Ta}+5.2\ W_{Al} \leq 36$. This is advantageous as it allows a suitable volume fraction γ' to be present.

In an embodiment, the nickel-based alloy composition is such that the following equation is satisfied in which $W_{Ta}$, $W_{Al}$, $W_{Ti}$, $W_{Nb}$ and $W_{V}$ are the weight percent of tantalum, aluminium, titanium, niobium and vanadium in the alloy respectively $4.2 \leq (W_{Ta}+W_{Ti}+W_{Nb}+W_{V})-0.5\ W_{Al}$. This is advantageous as it results in an alloy with a high APB energy and so good creep resistance.

In an embodiment, the nickel-based alloy composition is such that the following equation is satisfied in which $W_{W}$, $W_{Mo}$, $W_{Re}$ and $W_{Co}$ are the weight percent of tungsten, molybdenum, rhenium and cobalt in the alloy respectively $15.2 \leq [1.26(W_{W}+W_{Mo}+W_{Re})]+W_{Co}$, preferably $16.1 \leq [1.26(W_{W}+W_{Mo}+W_{Re})]+W_{Co}$. This is advantageous as it results in an alloy with a high creep resistance.

In an embodiment, the nickel-based alloy composition is such that the following equation is satisfied in which $W_{Ta}$ and $W_{W}$ are the weight percent of tantalum and tungsten in the alloy respectively $12.7 \geq W_{Ta}+0.87\ W_{W}$. This is advantageous as it results in an alloy with a relatively low density.

In an embodiment, the nickel-based alloy composition is such that the following equation is satisfied in which $W_{Cr}$ and $W_{W}$ are the weight percent of chromium and tungsten in the alloy respectively $11.64 \geq W_{Cr}+0.179\ W_{W}^{2}-1.54\ W_{W}$, preferably $10.75 \geq W_{Cr}+0.179\ W_{W}^{2}-1.54\ W_{W}$. This is advantageous as it results in an alloy with low susceptibility to TCP phase formation.

In an embodiment, in the nickel-based alloy composition, the sum of the elements niobium, titanium and vanadium, in weight percent, is less than 1%. This means that those elements do not have too much of a deleterious effect on environmental resistance of the alloy.

In an embodiment, in the nickel-based alloy composition, the sum of the elements niobium, titanium, vanadium and tantalum, by weight percent, is between 6.1 and 10.7%, preferably between 6.5 and 10.7% tantalum, more preferably between 6.6 and 9.4%. This results in a preferred volume fraction of γ'.

In an embodiment, the sum of the elements rhenium, molybdenum and tungsten is at least 2.5 wt %, preferably at least 3.3 wt. %, more preferably at least 4.2 wt. %. This achieves a good balance between creep resistance and low propensity for TCP phase formation.

In an embodiment, the nickel-based alloy composition consists, in weight percent, of between 0.0 and 0.3% rhenium. This is optimum for balancing creep resistance and cost.

In an embodiment, the nickel-based alloy composition consists, in weight percent, of 0.1% or more molybdenum. This is advantageous for improved creep resistance.

In an embodiment, a single crystal article is provided, formed of the nickel-based alloy composition of any of the previous embodiments.

In an embodiment, a turbine blade for a gas turbine engine is provided, formed of an alloy according to any of the previous embodiments.

In an embodiment, a gas turbine engine comprising the turbine blade of the previous embodiment is provided.

The term "consisting of" is used herein to indicate that 100% of the composition is being referred to and the presence of additional components is excluded so that percentages add up to 100%.

The invention will be more fully described, by way of example only, with reference to the accompanying drawings in which.

Figure 1:
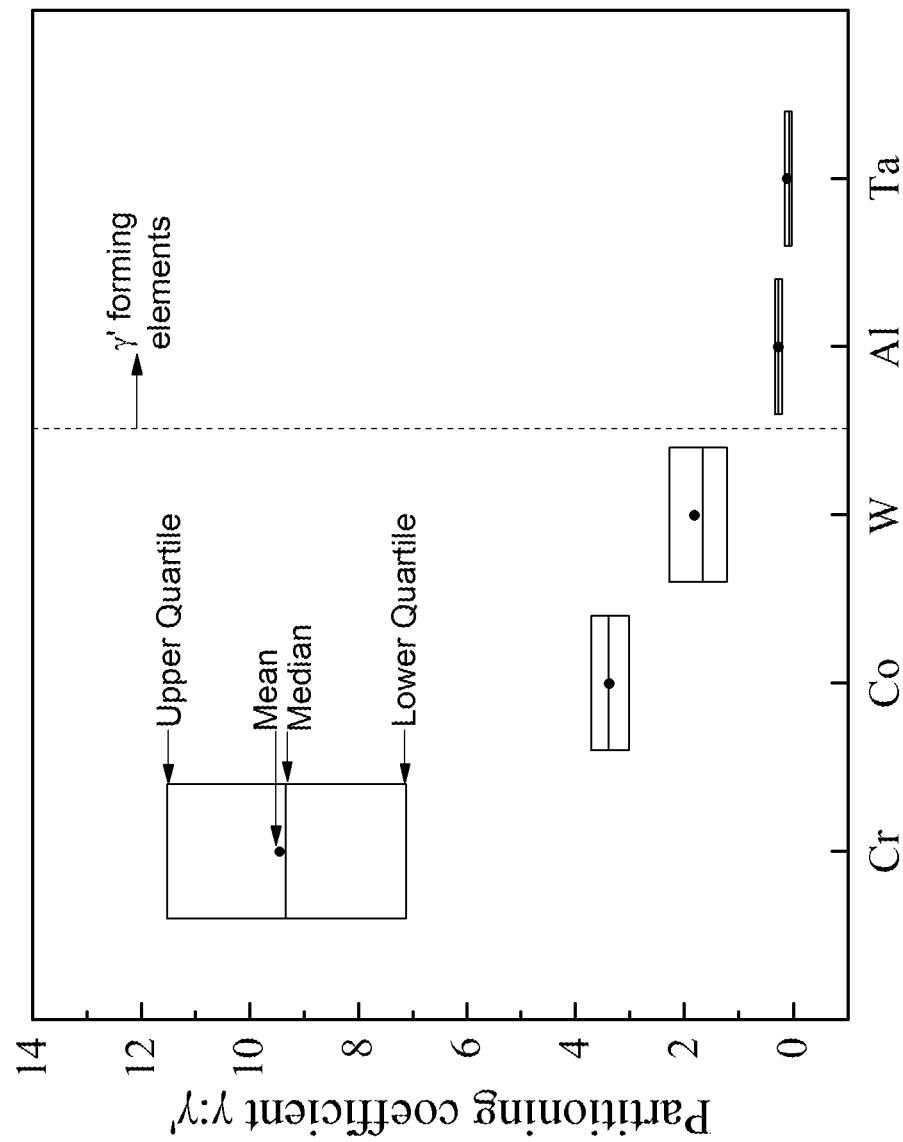
FIG. 1 shows the partitioning coefficient for the main components in the alloy design space.

Traditionally, nickel-based superalloys have been designed through empiricism. Thus their chemical compositions have been isolated using time consuming and expensive experimental development, involving small-scale processing of limited quantities of material and subsequent characterisation of their behaviour. The alloy composition adopted is then the one found to display the best, or most desirable, combination of properties. The large number of possible alloying elements indicates that these alloys are not entirely optimised and that improved alloys are likely to exist.

In superalloys, generally additions of chromium (Cr) and aluminium (Al) are added to impart resistance to oxidation, cobalt (Co) is added to improve resistance to sulphidisation. For creep resistance, molybdenum (Mo), tungsten (W), cobalt, rhenium (Re) and sometimes ruthenium (Ru) are introduced, because these retard the thermally-activated processes—such as, dislocation climb—which determine the rate of creep deformation. To promote static and cyclic strength, aluminium (Al), tantalum (Ta) and titanium (Ti) are introduced as these promote the formation of the precipitate hardening phase gamma-prime (γ'). This precipitate phase is coherent with the face-centered cubic (FCC) matrix phase which is referred to as gamma (γ).

A modelling-based approach used for the isolation of new grades of nickel-based superalloys is described here, termed the "Alloys-By-Design" (ABD) method. This approach utilises a framework of computational materials models to estimate design relevant properties across a very broad compositional space. In principle, this alloy design tool allows the so called inverse problem to be solved; identifying optimum alloy compositions that best satisfy a specified set of design constraints.

The first step in the design process is the definition of an elemental list along with the associated upper and lower compositional limits. The compositional limits for each of the elemental additions considered in this invention—referred to as the "alloy design space"—are detailed in Table 2.

TABLE 2

Alloys design space in wt. % searched using the "Alloys-by-Design" method.

| | Cr | Co | W | Al | Ta | Re |
|---|---|---|---|---|---|---|
| Min | 3 | 0 | 0 | 3 | 3 | 0 |
| Max | 16 | 13 | 13 | 9 | 16 | 1 |

The second step relies upon thermodynamic calculations used to calculate the phase diagram and thermodynamic properties for a specific alloy composition. Often this is referred to as the CALPHAD method (CALculate PHAse Diagram). These calculations are conducted at the service temperature for the new alloy (900° C.), providing information about the phase equilibrium (microstructure).

A third stage involves isolating alloy compositions which have the desired microstructural architecture. In the case of single crystal superalloys which require superior resistance to creep deformation, the creep rupture life generally improves as the volume fraction of the precipitate hardening phase γ' is increased, the most beneficial range for volume fraction of γ' lies between 60%-70%. At values above 70% volume fraction of γ' a drop in creep resistance is observed.

It is also necessary that the γ/γ' lattice misfit should conform to a small value, either positive or negative, since coherency is otherwise lost; thus limits are placed on its magnitude. The lattice misfit δ is defined as the mismatch between γ and γ' phases, and is determined according to $$\delta = \frac{2(a_{\gamma'} - a_{\gamma})}{a_{\gamma'} + a_{\gamma}} \quad (1)$$

where $a_{\gamma}$ and $a_{\gamma'}$ are the lattice parameters of the γ and γ' phases.

Rejection of alloy on the basis of unsuitable microstructural architecture is also made from estimates of susceptibility to topologically close-packed (TCP) phases. The present calculations predict the formation of the deleterious TCP phases sigma (σ), P and mu (μ) using CALPHAD modelling.

Thus the model isolates all compositions in the design space which are calculated to result in a desired volume fraction of γ', which have a lattice misfit γ' of less than a predetermined magnitude and have a total volume fraction of TCP phases below a predetermined magnitude.

In the fourth stage, merit indices are estimated for the remaining isolated alloy compositions in the dataset. Examples of these include: creep-merit index (which describes an alloy's creep resistance based solely on mean composition), anti-phase boundary (APB) energy, density and cost.

In the fifth stage, the calculated merit indices are compared with limits for required behaviour, these design constraints are considered to be the boundary conditions to the problem. All compositions which do not fulfil the boundary conditions are excluded. At this stage, the trial dataset will be reduced in size quite markedly.

The final, sixth stage involves analysing the dataset of remaining compositions. This can be done in various ways. One can sort through the database for alloys which exhibit maximal values of the merit indices—the lightest, the most creep resistant, the most oxidation resistant, and the cheapest for example. Or alternatively, one can use the database to determine the relative trade-offs in performance which arise from different combination of properties.

The example four merit indicies are now described.

The first merit index is the creep-merit index. The overarching observation is that time-dependent deformation (i.e. creep) of a single crystal superalloy occurs by dislocation creep with the initial activity being restricted to the γ phase. Thus, because the fraction of the γ' phase is large, dislocation segments rapidly become pinned at the γ/γ' interfaces. The rate-controlling step is then the escape of trapped configurations of dislocations from γ/γ' interfaces, and it is the dependence of this on local chemistry which gives rise to a significant influence of alloy composition on creep properties.

A physically-based microstructure model can be invoked for the rate of accumulation of creep strain ε̇ when loading is uniaxial and along the ⟨001⟩ crystallographic direction. The equation set is $$\dot{\varepsilon}_{\langle 001 \rangle} = \frac{16}{\sqrt{6}} \rho_m \phi_p D_{\mathit{eff}} (1 - \phi_p)(1/\phi_p^{1/3} - 1) \sinh\left\{\frac{\sigma b^2 \omega}{\sqrt{6}\, K_{CF} kT}\right\} \quad (2)$$

$$\dot{\rho}_m = C \dot{\varepsilon}_{\langle 001 \rangle} \quad (3)$$

where $\rho_m$ is the mobile dislocation density, $\phi_p$ is the volume fraction of the γ' phase, and ω is width of the matrix channels. The terms σ and T are the applied stress and temperature, respectively. The terms b and k are the Burgers vector and Boltzmann constant, respectively. The term $K_{CF} = 1 + 2\phi_p^{1/3}/3\sqrt{3\pi}(1-\phi_p^{1/3})$ is a constraint factor, which accounts for the close proximity of the cuboidal particles in these alloys. Equation 3 describes the dislocation multiplication process which needs an estimate of the multiplication parameter C and the initial dislocation density. The term $D_{eff}$ is the effective diffusivity controlling the climb processes at the particle/matrix interfaces.

Note that in the above, the composition dependence arises from the two terms $\phi_p$ and $D_{eff}$. Thus, provided that the microstructural architecture is assumed constant (microstructural architecture is mostly controlled by heat treatment) so that $\phi_p$ is fixed, any dependence upon chemical composition arises through $D_{eff}$. For the purposes of the alloy design modelling described here, it turns out to be unnecessary to implement a full integration of Equations 2 and 3 for each prototype alloy composition. Instead, a first order merit index $M_{creep}$ is employed which needs to be maximised, which is given by $$M_{creep} = \sum_i x_i / \tilde{D}_i \quad (4)$$

where $x_i$ is the atomic fraction of solute i in the alloy and $\tilde{D}_i$ is the appropriate interdiffusion coefficient.

The second merit index is for anti-phase boundary (APB) energy. Fault energies in the γ' phase—for example, the APB energy—have a significant influence on the deformation behaviour of nickel-based superalloys. Increasing the APB energy has been found to improve mechanical properties including, tensile strength and resistance to creep deformation. The APB energy was studied for a number of Ni—Al—X systems using density functional theory. From this work the effect of ternary elements on the APB energy of the γ' phase was calculated, linear superposition of the effect for each ternary addition was assumed when considering complex multicomponent systems, resulting in the following equation, $$\gamma_{APB} = 195 - 1.7x_{Cr} - 1.7x_{Mo} + 4.6x_W + 27.1x_{Ta} + 21.4x_{Nb} + 15x_{Ti} \quad (5)$$

where, $x_{Cr}$, $x_{Mo}$, $x_W$, $x_{Ta}$, $x_{Nb}$ and $x_{Ti}$ represent the concentrations, in atomic percent, of chromium, molybdenum, tungsten, tantalum, niobium and titanium in the γ' phase, respectively. The composition of the γ' phase is determined from phase equilibrium calculations.

The third merit index is density. The density, ρ, was calculated using a simple rule of mixtures and a correctional factor, where, $\rho_i$ is the density for a given element and $x_i$ is the atomic fraction of the alloy element.

$$\rho = 1.05[\Sigma_i x_i \rho_i] \quad (6)$$

The fourth merit index was cost. In order to estimate the cost of each alloy a simple rule of mixtures was applied, where the weight fraction of the alloy element, $x_i$, was multiplied by the current (2015) raw material cost for the alloying element, $c_i$.

$$Cost = \Sigma_i x_i c_i \quad (7)$$

The estimates assume that processing costs are identical for all alloys, i.e. that the product yield is not affected by composition.

The ABD method described above was used to isolate the inventive alloy composition. The design intent for this alloy was to optimise the composition of a nickel-based single crystal superalloy composition for IGT applications. The present invention required creep resistance comparable to equivalent alloy grades used for IGT applications along with significant improvements in corrosion resistance. The alloy has been designed such that it is of a relatively low cost which is advantageous for applications where large castings are required. This balance of properties make the new alloy suitable for IGT applications where fuels lead to aggressive corrosion damage. Control of other material properties, such as, density, microstructural stability (i.e. remaining substantially free from undesirable TCP phases) and lattice misfit were also considered in the design so that optimal performance was realised.

The material properties—determined using the ABD method—for the typical compositions of nickel-based single crystal superalloys which are used in IGT engines are is listed in Table 3. The design of the new alloy was considered in relation to the predicted properties listed for these alloys. The calculated material properties for an alloy ABD-3 with a nominal composition according to Table 4 and in accordance with the present invention are also given.

The rationale for the design of the new alloy is now described.

TABLE 3

Calculated phase fractions and merit indices made with the "Alloys-by-Design" software. Results for single crystal turbine blades used for IGT applications listed in Table 1 and the nominal composition of the new alloy ABD-3 listed in Table 4.

| Alloy | Phase Fractions | | | | | Creep Merit Index | Density | Cost | $\gamma_{APB(111)}$ | γ/γ' Misfit |
| --- | --- | --- | --- | --- | --- | --- | --- | --- | --- | --- |
| | γ' | σ | P | μ | σ + P + μ | ($m^{-2}s \times 10^{-15}$) | (g/cm³) | ($/lb) | (mJ/m²) | (%) |
| Nasair100 | 0.69 | 0.00 | 0.014 | 0.000 | 0.014 | 3.79 | 8.5 | 12.75 | 270 | −0.25 |
| CMSX-2 | 0.66 | 0.00 | 0.000 | 0.000 | 0.000 | 4.11 | 8.6 | 15.34 | 303 | −0.04 |
| CMSX-6 | 0.64 | 0.00 | 0.000 | 0.000 | 0.000 | 2.34 | 8.0 | 11.65 | 335 | −0.06 |
| PWA1480 | 0.70 | 0.00 | 0.000 | 0.000 | 0.000 | 3.56 | 8.7 | 20.41 | 385 | 0.32 |
| SRR99 | 0.69 | 0.00 | 0.000 | 0.000 | 0.000 | 4.59 | 8.5 | 12.69 | 294 | −0.10 |
| RR2000 | 0.61 | 0.00 | 0.000 | 0.000 | 0.000 | 4.15 | 0.0 | 10.18 | 298 | −0.17 |
| ReneN4 | 0.60 | 0.00 | 0.011 | 0.000 | 0.011 | 4.33 | 8.5 | 13.92 | 380 | 0.05 |
| AM1 | 0.63 | 0.00 | 0.000 | 0.000 | 0.000 | 4.00 | 8.7 | 17.20 | 333 | −0.07 |
| AM3 | 0.69 | 0.00 | 0.000 | 0.000 | 0.000 | 3.52 | 8.3 | 13.06 | 286 | −0.26 |
| TMS-6 | 0.64 | 0.00 | 0.000 | 0.000 | 0.000 | 3.57 | 8.9 | 18.99 | 335 | 0.02 |
| TMS-12 | 0.63 | 0.00 | 0.000 | 0.000 | 0.000 | 4.35 | 9.1 | 16.91 | 303 | −0.16 |
| PWA1483 | 0.57 | 0.00 | 0.005 | 0.000 | 0.005 | 4.25 | 8.4 | 14.52 | 391 | 0.10 |
| MC2 | 0.62 | 0.00 | 0.013 | 0.000 | 0.013 | 4.22 | 8.7 | 15.53 | 321 | −0.12 |
| ABD-3 | 0.50 | 0.00 | 0.000 | 0.000 | 0.000 | 4.75 | 8.5 | 16.26 | 312 | 0.13 |

Optimisation of the alloy's microstructure—primarily comprised of an austenitic face centre cubic (FCC) gamma phase (γ) and the ordered L1$_2$ precipitate phase (γ')—was required to maximise creep resistance. Typically, maximal creep resistance is achieved when alloys contain between 60-70% volume fraction of the γ' phase. However, in the case of the present invention a range of 50-70% γ' volume fraction was considered in order to balance trade-offs. The minimum of 50% γ' volume fraction achieves adequate creep resistance, whilst the upper limit is there to ensure adequate oxidation/corrosion resistance and microstructural stability as will become clearer from the below explanation. The trade-off between these properties is presented in FIGS. 7-10: as oxidation/corrosion resistance is improved (additions of chromium) and creep resistance is improved (increased tungsten content and increased volume fraction of γ') increasing levels of deleterious TCP phases are precipitated.

The partitioning coefficient for each element included in the alloy design space was determined from phase equilibrium calculations conducted at 900° C., FIG. 1. A partitioning coefficient of unity describes an element with equal preference to partition to the γ or γ' phase. A partitioning coefficient less than unity describes an element which has a preference for the γ' phase, the closer the value to zero the stronger the preference. The greater the value above unity the more an element prefers to reside within the γ phase. The partitioning coefficients for aluminium and tantalum show that these are strong γ' forming elements. The elements chromium, cobalt and tungsten partition preferably to the γ phase. For the elements considered within the alloy design space, aluminium and tantalum partition most strongly to the γ' phase. Hence, aluminium and tantalum levels were controlled to produce the desired γ' volume fraction.

Figure 2:
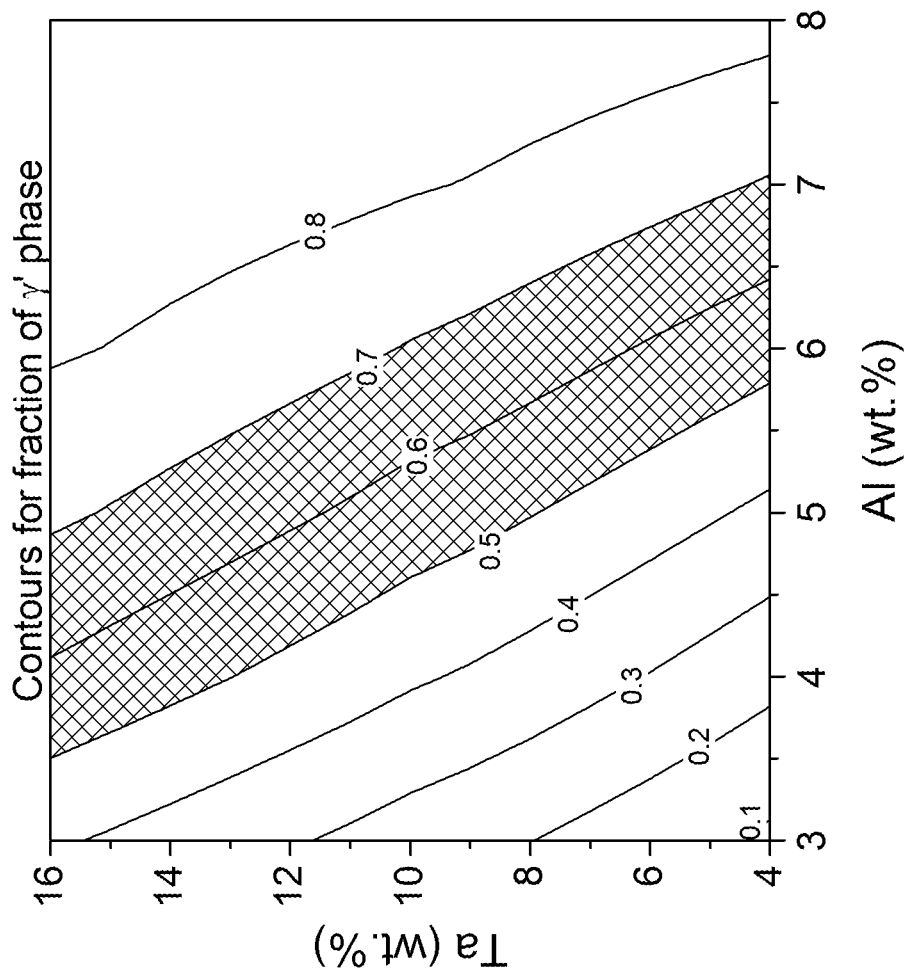
FIG. 2 is a contour plot showing the effect of γ' forming elements aluminium and tantalum on volume fraction of γ' for alloys within the alloy design space, determined from phase equilibrium calculations conducted at 900° C.

FIG. 2 shows the effect which elements added to form the γ' phase—predominantly aluminium and tantalum—have on the fraction of γ' phase in the alloy at the operation temperature, 900° C. in this instance. For the design of this alloy compositions which result in a volume fraction of γ' between 50-70% were considered. Hence between 3.5 and 7.0 weight percent (wt. %) of aluminium was required.

The change in γ' volume fraction was related to the change in aluminium and tantalum content according to the formula $$f(\gamma')=W_{Ta}+5.2W_{Al}$$

where, f(γ') is a numerical value which ranges between 33 and 45 for an alloy with the desired γ' fraction, between 0.5 and 0.7 in this case, and $W_{Ta}$ and $W_{Al}$ are the weight percent of tantalum and aluminium in the alloy, respectively.

Figure 3:
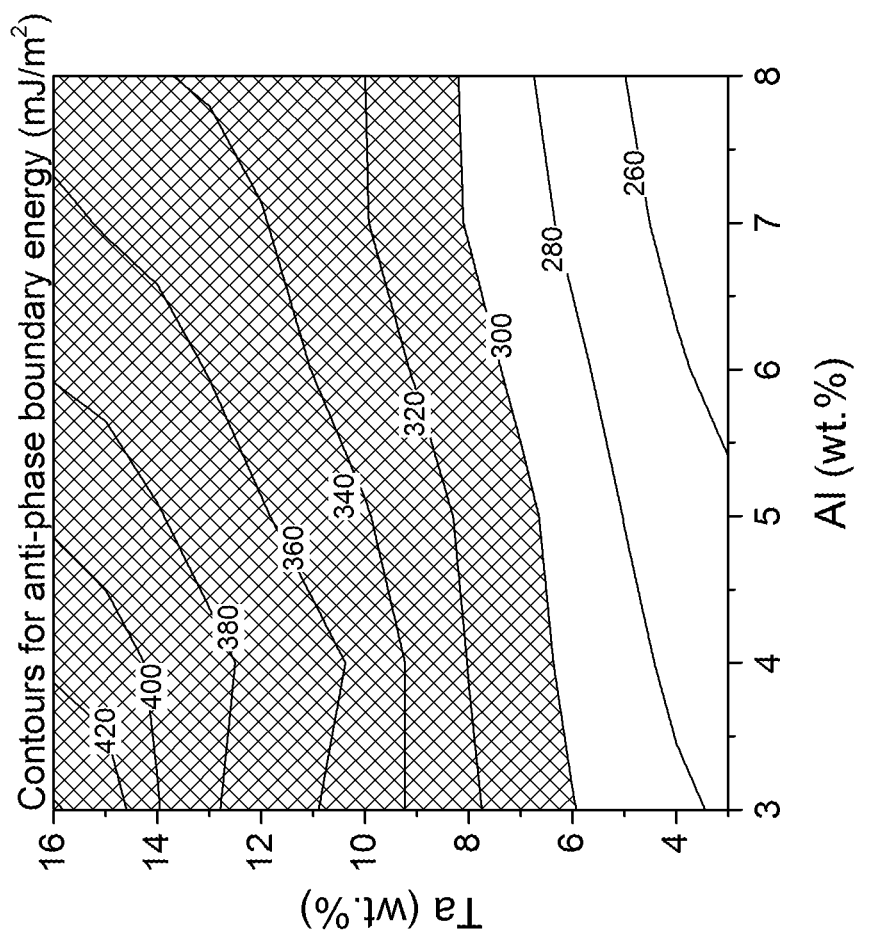
FIG. 3 is a contour plot showing the effect of elements aluminium and tantalum on anti-phase boundary energy, for alloys with a volume fraction of γ' between 50-70%.

Optimisation of aluminium and tantalum levels was also required to increase the anti-phase boundary (APB) energy of the γ' phase. The APB energy is strongly dependent upon the chemistry of the γ' phase. FIG. 3 shows the influence of aluminium and tantalum on the APB energy. It was necessary to isolate alloy compositions where the APB energy was equivalent to or greater than alloys suitable for industrial gas turbines applications (~300 mJ/m$^2$). Modelling calculation showed that tantalum levels in the alloy greater than 6.1 wt. % produce an alloy with an acceptably high APB energy and so high creep resistance.

The change in APB energy was related to the change in aluminium and tantalum content according to the formula $$f(APB)=W_{Ta}-0.5W_{Al}$$

where, f(APB) is a numerical value which is greater than or equal to 4.2 in order to produce an alloy with an APB energy of greater than 300 mJ/m$^2$. Desirably f(APB) is greater than or equal to 5.0, resulting in an alloy with an even higher APB energy.

Figure 6:
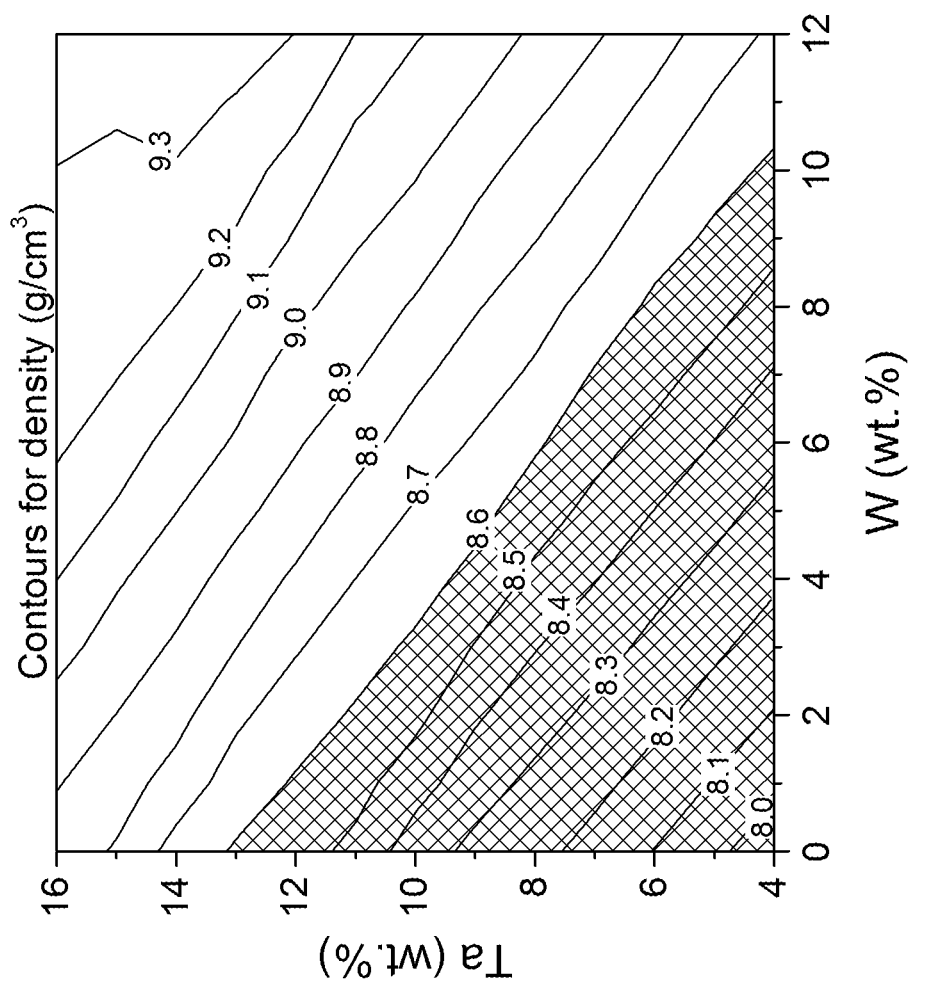
FIG. 6 is a Contour plot showing the effect of tantalum and tungsten content on density, for alloys with a volume fraction of γ' between 50-70%.
Figure 7:
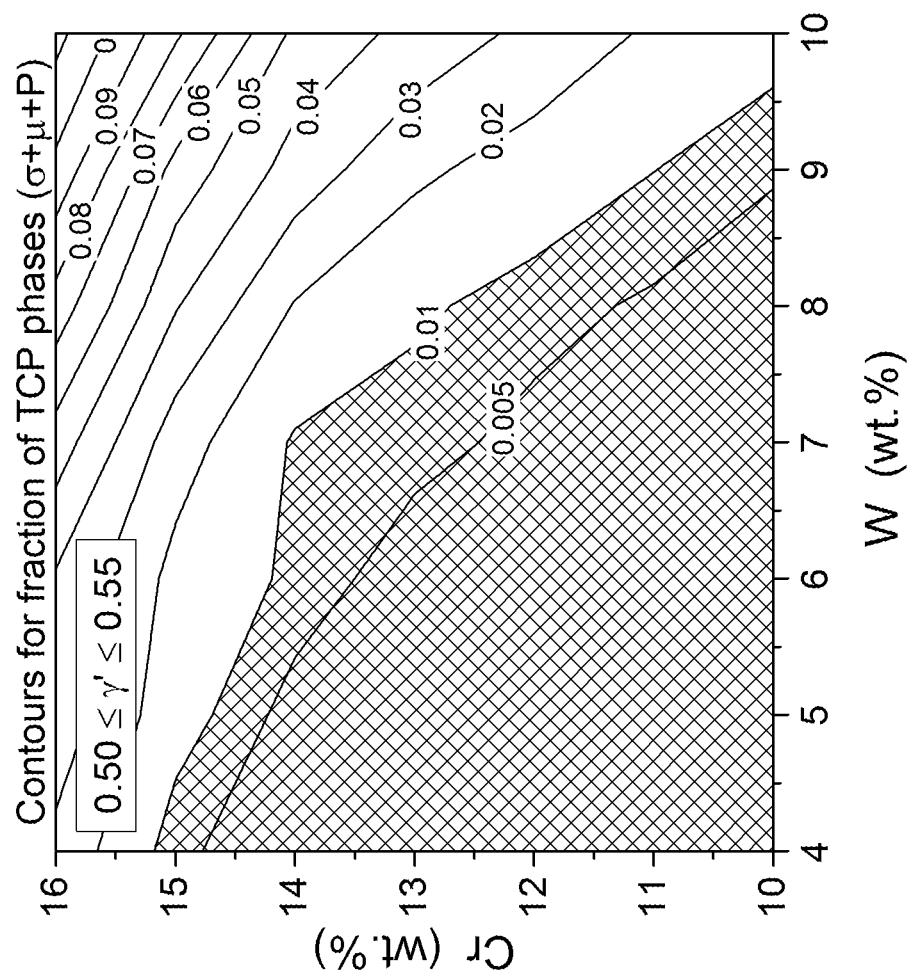
FIG. 7 shows the effects of elements chromium and tungsten on microstructural stability, for alloys with a volume fraction of γ' between 0.50-0.55.
Figure 8:
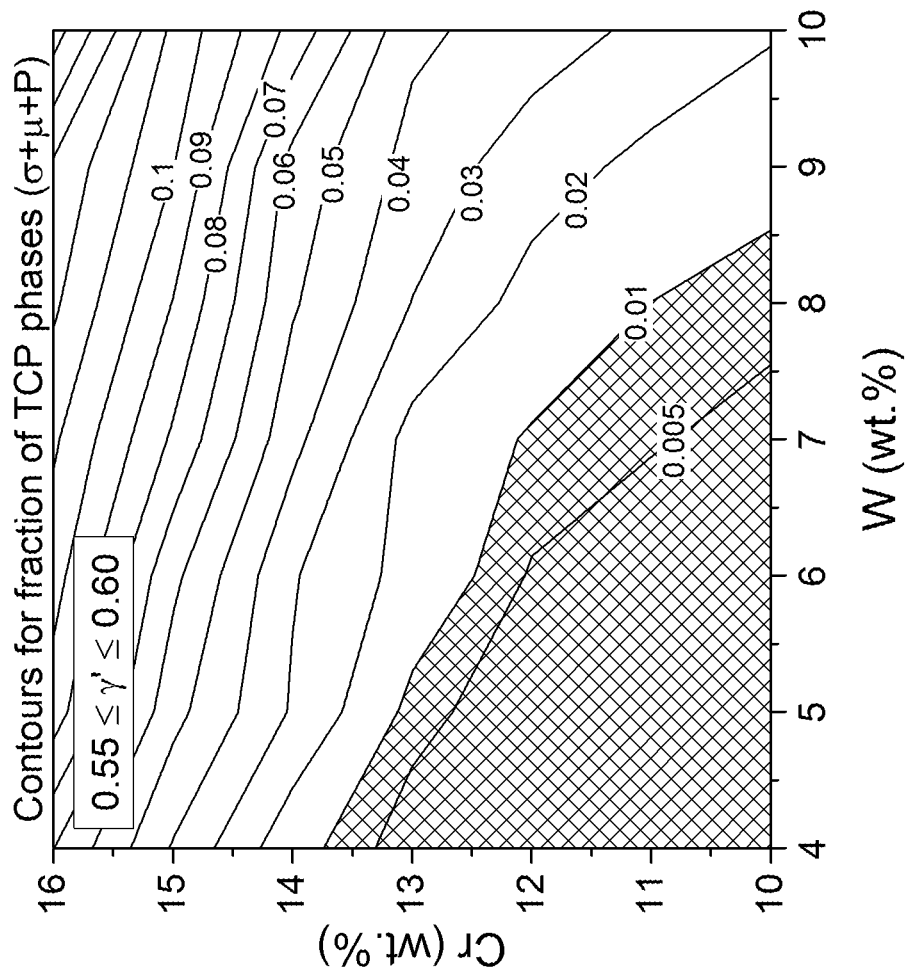
FIG. 8 shows the effects of elements chromium and tungsten on microstructural stability, for alloys with a volume fraction of γ' between 0.55-0.60.
Figure 9:
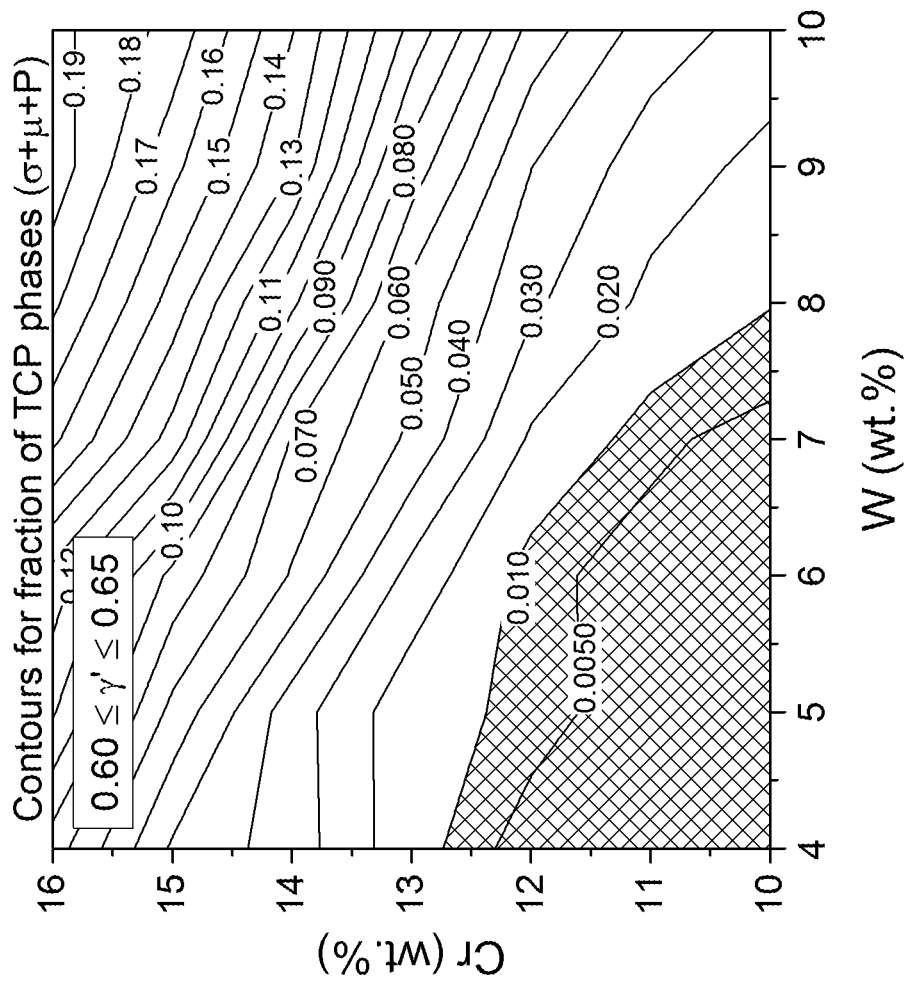
FIG. 9 shows the effects of elements chromium and tungsten on microstructural stability, for alloys with a volume fraction of γ' between 0.60-0.65.
Figure 10:
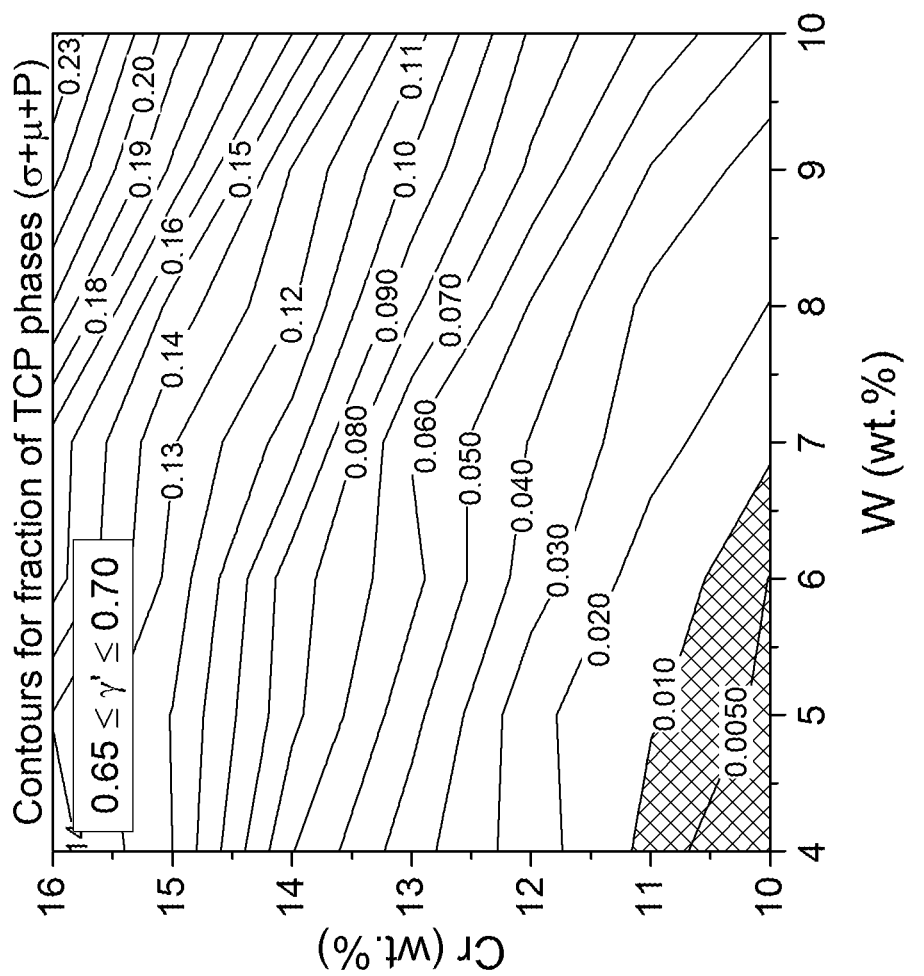
FIG. 10 shows the effects of elements chromium and tungsten on microstructural stability, for alloys with a volume fraction of γ' between 0.65-0.70.

The minimum Ta concentration required results in aluminium additions being limited to a maximum of 6.7 wt. % so that the desired γ' volume fraction can be achieved, FIG. 2. Therefore, an aluminium concentration of between 3.5 and 6.7 wt. % is required to achieve both the desired γ' volume fraction and an acceptably high APB energy. The maximum tantalum content will be explained below with reference to FIG. 6 and results in a tantalum range of 6.1-10.7 wt. %, a preferred range of 6.5 to 10.7 wt %, or a more preferred range of 6.6-9.4 wt. %, this results from the preferred combination of density (dealt with below) and APB energy. That is, the preferred minimum levels of tantalum ensure a higher APB energy for any given amount of aluminium and a level of at least 300 mJ/m$^2$ in the range of aluminium for the alloy. From FIG. 2 it is seen that in order to allow higher minimum levels of tantalum, concentrations of aluminium of 4.5 wt. % and 4.7 wt. % are preferable to produce the desired volume fraction of γ'.

Niobium (Nb), titanium (Ti), vanadium (V) elements behave in a similar way to that of tantalum i.e. they are γ' forming elements which increase anti-phase boundary energy. These elements can optionally be added to the alloy. Additions of these elements are desirable such that they adhere to the following Equation, $$f(APB)=(W_{Ta}+W_{Ti}+W_{Nb}+W_{V})-0.5W_{Al}$$

where, f(APB) is a numerical value which is greater than or equal to 4.2 in order to produce an alloy with an APB energy of greater than 300 mJ/m$^2$, where $W_{Ti}$, $W_{Nb}$ and $W_{V}$ are the weight percent of titanium, niobium and vanadium in the alloy, respectively.

The benefits of adding niobium, titanium or vanadium may include lower cost and density in comparison to tantalum. However, additions of these elements must be limited as they can have a negative impact on the environmental resistance of the alloy. Therefore, those elements can each be present in an amount of up to 0.5 wt. %. Preferably those elements are substituted for tantalum meaning that the sum of the elements consisting of niobium, titanium, vanadium and tantalum is preferably limited to 6.1-10.7 wt. %, more preferably 6.5-10.7 wt %, yet more preferably 6.6-9.4 wt. % which are the preferred ranges for tantalum. Independently, in an embodiment, the sum of the elements consisting of niobium, titanium and vanadium is preferably limited to below 1.0 wt. % and preferably below 0.5 wt. % so as to avoid reduction in environmental resistance of the alloy.

For the alloys which satisfied the previously described requirements it was necessary to optimise the levels of refractory elements for maximum creep resistance. The creep resistance was determined by using the creep merit index model. The influence which tungsten and cobalt have on creep resistance is presented in FIG. 4. It is desirable to maximise the creep merit index as this is associated with an improved creep resistance. It is seen that increasing the levels of tungsten and cobalt will improve creep resistance.

A creep merit index of 4.5×10$^{-15}$ m$^{-2}$s or greater was necessary to produce an alloy with creep resistance comparable to current second generation single crystal alloys (see Table 3).

Figure 4:
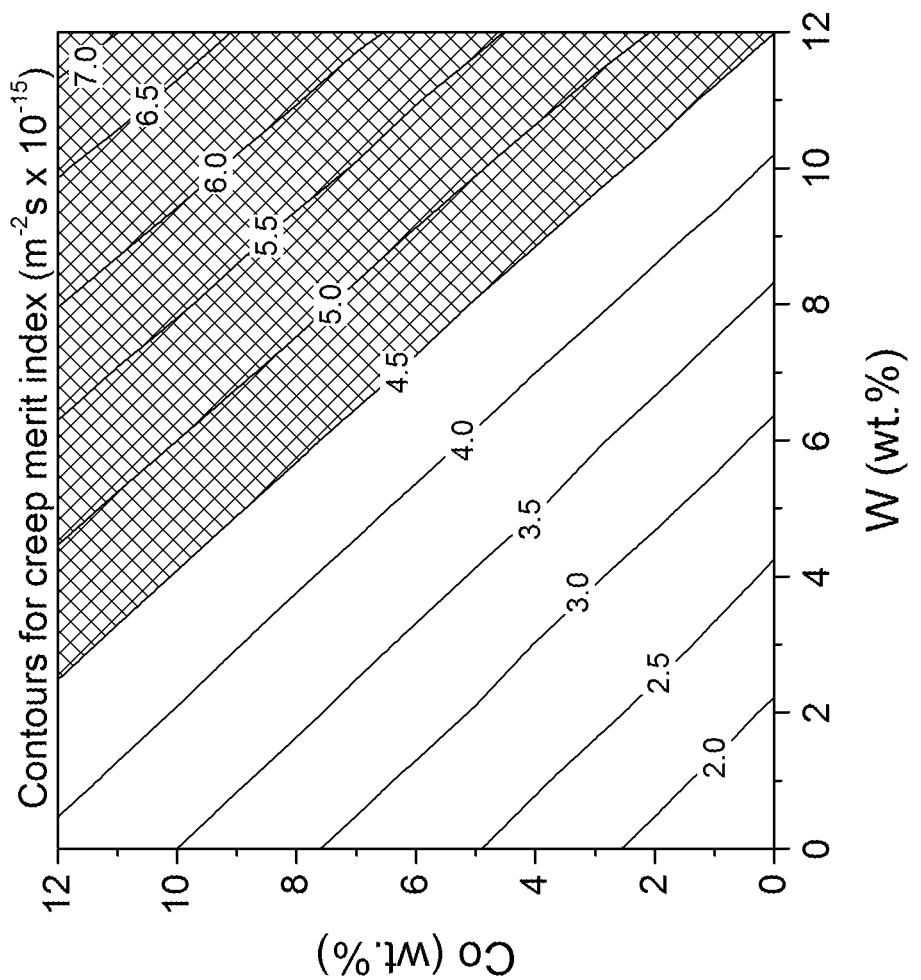
FIG. 4 is a Contour plot showing the effect cobalt and tungsten on creep resistance (in terms of creep merit index), for alloys with a volume fraction of γ' between 50-70%.

FIG. 4 shows that a minimum of 2.5 wt. % of tungsten is required to impart sufficient creep resistance. Modelling calculations show that cobalt increases the creep merit index. Additions of cobalt are also know to lower the stacking fault energy in the gamma matrix, this also improves creep resistance. However, cobalt additions must be limited as high cobalt levels will increase the alloy's creep anisotropy, particularly in primary creep. This makes the creep rate strongly dependent upon orientation of the single crystal. An upper limit of 12 wt. %, preferably 11 wt. % cobalt is necessary to control the amount creep of anisotropy to an acceptable level. The preferred minimum concentration of tungsten is 3.3 wt. % so as to allow a lower level of cobalt so that the propensity for creep anisotropy can be reduced.

As higher levels of chromium and tungsten are preferred to increase oxidation resistance and creep resistance respectively, a lower γ' volume fraction is preferred because microstructural instability (FIGS. 7-10) can otherwise result. Therefore, it is more preferable that the creep merit index is greater than any of the alloys listed in Table 3 (~4.6×10$^{-15}$ m$^{-2}$s) so as to compensate for the lower γ' volume fraction. Therefore an alloy with a creep merit index of greater than or equal to 4.7×10$^{-15}$ m$^{-2}$s is preferred. So as to allow lower maximum cobalt concentration (11 wt. %) a preferable minimum level of 4.2 wt. % tungsten is proposed to achieve the desired value for creep merit index.

Molybdenum behaves in a similar way to tungsten i.e. this slow diffusing element can improve creep resistance. Therefore, it is preferred that molybdenum is present in an amount of at least 0.1 wt %. However, additions of molybdenum must be controlled as it strongly increases the alloys propensity to form deleterious TCP phases. Therefore, molybdenum present in an amount up to 0.5 wt. % can be beneficial.

Figure 5:
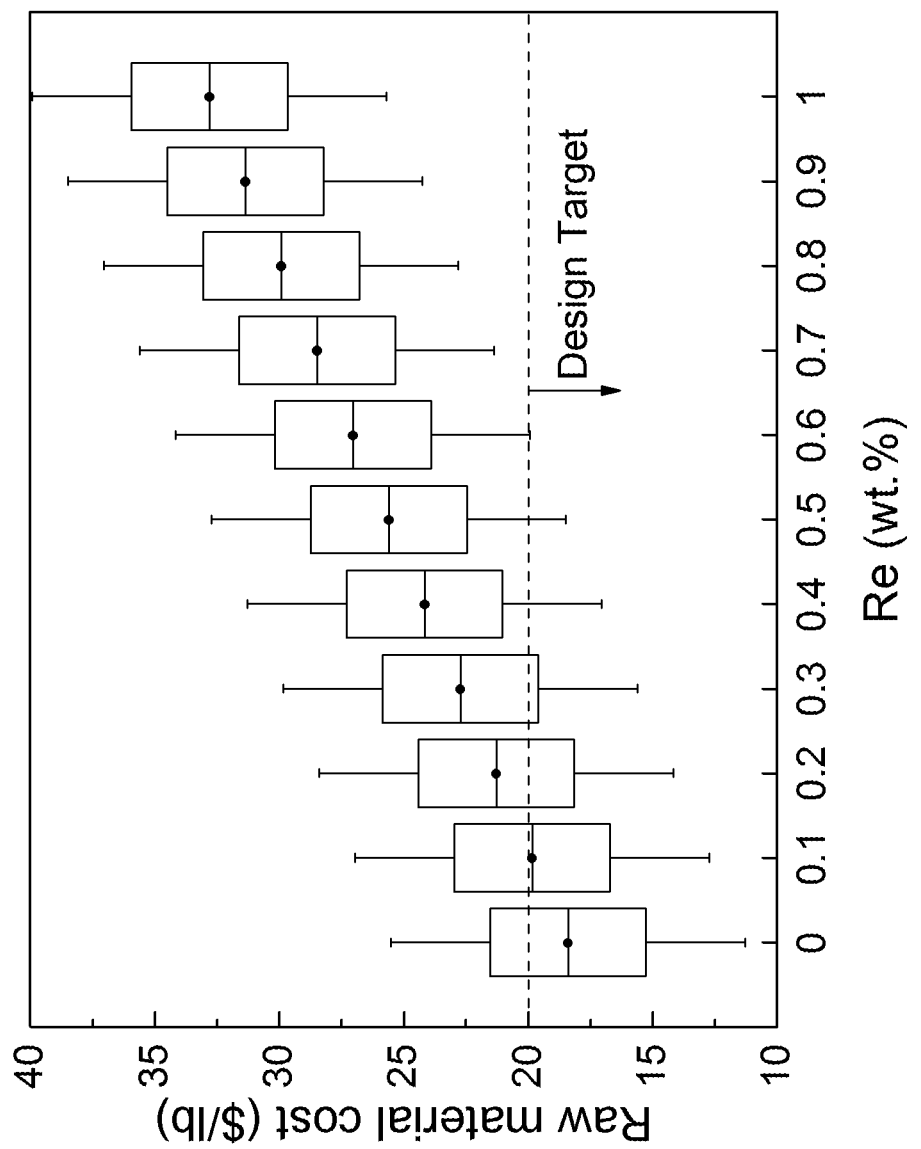
FIG. 5 shows the effect of rhenium content on raw material cost for alloys with a volume fraction of γ' between 50-70%.

Rhenium provides substantially greater improvements to creep resistance in comparison to tungsten. However, the relatively high cost of rhenium means that its usage must be limited in order to control alloy cost. FIG. 5 shows the correlation between Re content and alloy cost. To maintain a cost equivalent to or lower than current alloys rhenium in an amount up to 0.5 wt. %, preferably 0.3 wt. %, can be included to provide improvements in creep with limited impact on cost.

Preferably molybdenum and/or rhenium is/are substituted for tungsten where the sum of the elements consisting of tungsten and rhenium and molybdenum is at least 2.5%, preferably greater than 3.3 wt. %, more desirably greater than 4.2 wt. %.

The level of tungsten can be reduced to 2.5 wt. % or more preferably 3.3 wt. %, particularly if molybdenum (up to 0.5 wt. % additions) and rhenium (up to 0.3 wt. % additions) are present as these elements behave similarly to tungsten in improving creep resistance.

It is preferred that the sum of the alloying elements tungsten and cobalt is greater than 13.5 wt. %, in order to produce an alloy with sufficient creep resistance (calculated on the basis of the position of the 4.5 m$^{-2}$s×10$^{-15}$ contour of FIG. 4). In another embodiment, the sum of the alloying elements tungsten, rhenium, molybdenum and cobalt is greater than 13.5 wt. % because rhenium and molybdenum can substitute tungsten.

A good level of creep resistance is achieved when additions of tungsten, rhenium, molybdenum and cobalt adhere to the following Equation, $$f(\text{Creep})=[1.26(W_W+W_{Mo}+W_{Re})]+W_{Co}$$

where, f(Creep) is a numerical value which is greater than or equal to 15.2 in order to produce an alloy with a creep merit index as calculated of 4.5 m$^{-2}$s×10$^{-15}$ or more and $W_W$, $W_{Mo}$, $W_{Re}$ and $W_{Co}$ are the weight percent of tungsten, molybdenum, rhenium and cobalt in the alloy, respectively.

Preferably the numerical value for f(Creep) is greater than 16.1 as this produces an alloy with even better creep resistance.

For IGT applications it is advantageous to limit the density of the alloy. In particular for rotating components, where the high rotational speeds result in high stresses in the engine assembly. These stresses are strongly influenced by density. The alloys listed in Table 1 have densities ranging between 8.0-9.1 g/cm$^3$ as shown in Table 3. The objective of the design was to limit the alloy density to 8.6 g/cm$^3$, preferably designing an alloy with a density of 8.5 g/cm$^3$ or lower. Additions of tantalum and tungsten had the strongest influence upon density, as these elements have a density greater than nickel. Based upon the minimum required levels of Ta (6.1 wt % to achieve an acceptable APB energy) limiting the density of the alloy to 8.6 g/cm$^3$ requires the concentration of tungsten to be less than or equal to 8.3 wt. %. However, the preferred maximum tungsten concentration is restricted to 6.4 wt. % limiting the alloy density to less than 8.5 g/cm$^3$ for the minimum required levels of tantalum (6.1 wt. %). It is preferred that the maximum tungsten content is 5.8 wt. % in order to produce and alloy with a density of 8.5 g/cm$^3$ or less. The tantalum content is limited to 10.7 wt. % to achieve a density of less than 8.6 g/cm$^3$. It is preferable that the tantalum content is limited to 9.4 wt. % so that density remains below 8.5 g/cm$^3$ at low levels of tungsten. It is also preferable to limit the sum of tungsten and tantalum to 14.4 wt. %, preferably to 12.6 wt. %, to control alloy density (see FIG. 6 which shows the effects of tungsten and tantalum on density and the position of the 8.6 and 8.5 g/cm$^3$ contours which equate to a sum of 14.4 wt % and 12.6 wt % respectively). The raw elemental cost of tantalum is quite high, so there are cost benefits to reducing it. Also high levels of tantalum may lead to the formation of the deleterious eta phase (Ni$_3$Ta) which can degrade the mechanical properties.

A low density is achieved when additions of tantalum and tungsten adhere to the following Equation, $$f(\text{Density})=W_{Ta}+0.87W_W$$

where, f(Density) is a numerical value which is less than or equal to 12.7 in order to produce an alloy with a low density. Preferably the numerical value for f(Density) is less than 11.7 as this produces an alloy with even lower density.

Considering the influence of cobalt and tungsten on creep merit index the minimum cobalt levels are selected according to maximum allowable levels of tungsten, FIG. 4. The upper limit for tungsten additions (8.3 wt. %, due to density considerations) requires that the minimum cobalt concentration is 4.8 wt. % to achieve a creep resist index of at least 4.5 m$^{-2}$s×10$^{-15}$. It is preferred that the minimum cobalt concentration is 7.1 wt. % to allow a lower level of tungsten (6.4 wt % or less) so as to keep density low. It is more preferred than the minimum cobalt level is 7.8 wt. % to allow a lower level of tungsten (up to 5.8 wt %) to keep density low. Control of the cobalt level is necessary to ensure a sufficiently high creep merit index is attained so that the alloy will have acceptable creep resistance.

In order to remain resistant to creep over a significant time period the addition of slow diffusing elements tungsten, cobalt, rhenium and molybdenum is beneficial. Additions of chromium are also beneficial to promote resistance to oxidation/corrosion damage. As the newly designed alloy was required to have improved oxidation behaviour compared to the alloys listed in Table 1 it was desired that chromium content was greater than 12.3 wt. %, higher than any of the alloys in Table 1, with the aim of achieving oxidation corrosion resistance at least equal to if not better than the alloys of Table 1. Preferably the chromium content was greater than 12.5, 12.7 or 13.0 wt. % so that it is much higher than all alloys listed in Table 1, so that oxidation resistance was better than currently deployed alloys.

The addition of high levels of tungsten and chromium were found to increase the propensity to form unwanted TCP phases (FIGS. 7-10), primarily σ, P and μ phases. The newly designed alloy desirably contains less than 1% volume fraction of TCP phases, or more preferably less than 0.5% of TCP phases at equilibrium at 900° C.

FIGS. 7-10 show the effect of chromium and tungsten additions on the overall fraction of TCP phases (σ+μ+P) for alloys containing different levels of γ' fraction at equilibrium at 900° C. It is seen that increasing the volume fraction of γ' limits the maximum allowable concentration of chromium and tungsten if the alloy is to meet the requirements for limited TCP formation. For alloys containing greater than 65% volume fraction of γ' (FIG. 10) an alloy with the minimum required chromium level is difficult to achieve. Therefore, preferably the alloy contains less than 65% volume fraction of γ', meaning the value for f(γ') must range between 33 and 41 in order to produce an alloy with the preferred γ' fraction. More preferably an alloy with between 50-60% volume fraction of γ' is designed, meaning the value for f(γ') ranges between 33 and 39, this allows for a greater chromium content (13 wt. % or greater) to be included in the alloy along with a greater tungsten content for increased creep resistance. To achieve such a volume fraction of γ' the maximum aluminium content is limited to 6.4% in a preferred embodiment. Even more preferably the γ' volume fraction is limited between 50-55%, meaning the value for f(γ') ranges between 33 and 36, as then even more chromium can be included within the alloy along with more tungsten content without formation of deleterious TCP phases. This provides the optimal balance between creep resistance and oxidation/corrosion resistance. Hence in an embodiment the maximum aluminium content is restricted to 5.7 wt. % in order to attain the most preferred volume fraction of γ'. From FIG. 7 it can be seen that the chromium is limited to 15.2 wt. % or more preferably to 14.7 wt. % in order to limit the formation of TCP phases to less than 1% volume fraction or more preferably less than 0.5% volume fraction.

In order to limit the formation of TCP phases, additions of chromium and tungsten preferably adhere to the following Equation, $$f(TCP) = W_{Cr} + 0.179 W_W^2 - 1.54 W_W$$

where, f(TCP) is a numerical value which is less than or equal to 11.64 and $W_{Cr}$ is the weight percent of chromium in the alloy. Preferably the numerical value for f(TCP) is less than 10.75 as this produces an alloy which is less susceptible to TCP phase formation.

Considering the preferred range for volume fraction γ' of 50-60% and the more preferred range of 50-55%, it is preferred to have the sum of the elements aluminium and tantalum between 11.5-16.0 wt. %, or more preferably between 11.5 and 15.5% (based on FIG. 2).

It is beneficial that when the alloy is produced, it is substantially free from incidental impurities. These impurities may include the elements carbon (C), boron (B), sulphur (S), zirconium (Zr) and manganese (Mn). If concentrations of carbon remain at 100 PPM or below (in terms of mass) the formation of unwanted carbide phases will not occur. Boron content is desirably limited to 50 PPM or less (in terms of mass) so that formation of unwanted boride phases will not occur. Carbide and boride phases tie up elements such as tungsten or tantalum which are added to provide strength to the γ and γ' phases. Hence, mechanical properties including creep resistance are reduced if carbon and boron are present in greater amounts. The elements Sulphur (S) and Zirconium (Zr) preferably remain below 30 and 500 PPM (in terms of mass), respectively. Manganese (Mn) is an incidental impurity which is preferably limited to 0.05 wt % (500 PPM in terms of mass). The presence of Sulphur above 0.003 wt. % can lead to embrittlement of the alloy and sulphur also segregates to alloy/oxide interfaces formed during oxidation. This segregation may lead to increased spallation of protective oxide scales. The levels of zirconium and manganese must be controlled as these may create casting defects during the casting process, for example freckling. If the concentrations of these incidental impurities exceed the specified levels, issues surround product yield and deterioration of the material properties of the alloy is expected.

Additions of hafnium (Hf) of up to 0.5 wt. %, or more preferably up to 0.2 wt. % are beneficial for tying up incidental impurities in the alloy, in particular carbon. Hafnium is a strong carbide former, so addition of this element is beneficial as it will tie up any residual carbon impurities which may be in the alloy. It can also provide additional grain boundary strengthening, which is beneficial when low angle boundaries are introduced in the alloy.

Additions of the so called 'reactive-elements', Silicon (Si), Yttrium (Y), Lanthanum (La) and Cerium (Ce) may be beneficial up to levels of 0.1 wt. % to improve the adhesion of protective oxide layers, such as $Al_2O_3$. These reactive elements can 'mop-up' tramp elements, for example sulphur, which segregates to the alloy oxide interface weakening the bond between oxide and substrate leading to oxide spallation. In particular, it has been shown that additions of silicon to nickel based superalloys at levels up to 0.1 wt. % are beneficial for oxidation properties. In particular silicon segregates to the alloy/oxide interface and improves cohesion of the oxide to the substrate. This reduces spallation of the oxide, hence, improving oxidation resistance.

Based upon the description of the invention presented in this section, broad and preferred ranges for each elemental addition were defined, these ranges are listed in Table 4. An example composition—alloy ABD-3—was selected from the preferred compositional range, the composition of this alloy is defined in Table 4. Alloy ABD-3 was found to be amenable to standard methods used for the production of single crystal turbine blade components. This production method involves: preparation of an alloy with the composition of ABD-3, preparation of a mould for casting the alloy using investment casting methods, casting the alloy using directional solidification techniques where a 'grain selector' is used to produce a single crystal alloy, subsequent multi-step heat treatment of the single crystal casting.

TABLE 4

Compositional range in wt. % for the newly design alloy.

| | Broad | | Preferred | | Nominal |
| --- | --- | --- | --- | --- | --- |
| | Min | Max | Min | Max | (ABD-3) |
| Cr | 12.3 | 15.2 | 13.0 | 14.7 | 13.0 |
| Co | 4.8 | 12.0 | 7.1 | 11.0 | 10.0 |
| W | 2.5 | 8.3 | 3.3 | 6.4 | 5.0 |
| Al | 3.5 | 6.7 | 4.5 | 6.4 | 5.4 |
| Ta | 6.1 | 10.7 | 6.5 | 10.7 | 7.0 |
| Mo | 0.0 | 0.5 | 0.0 | 0.5 | 0.0 |
| Re | 0.0 | 0.5 | 0.0 | 0.3 | 0.0 |
| Hf | 0.0 | 0.5 | 0.0 | 0.2 | 0.0 |

TABLE 4-continued

Compositional range in wt. % for the newly design alloy.

|  | Broad | | Preferred | | Nominal |
| --- | --- | --- | --- | --- | --- |
|  | Min | Max | Min | Max | (ABD-3) |
| Nb | 0.0 | 0.5 | 0.0 | 0.5 | 0.0 |
| V  | 0.0 | 0.5 | 0.0 | 0.5 | 0.0 |
| Ti | 0.0 | 0.5 | 0.0 | 0.5 | 0.0 |
| Si | 0.0 | 0.1 | 0.0 | 0.1 | 0.0 |
| Y  | 0.0 | 0.1 | 0.0 | 0.1 | 0.0 |
| Ce | 0.0 | 0.1 | 0.0 | 0.1 | 0.0 |
| La | 0.0 | 0.1 | 0.0 | 0.1 | 0.0 |

Experiment testing of alloy ABD-3 was used to validate the key material properties claimed within this patent, mainly sufficient creep resistance and improved oxidation behaviour in comparison to that of a current single crystal alloys used for IGT applications. The behaviour of alloy ABD-3 was compared with alloy PWA1483, which was tested under the same experimental conditions.

Single crystal castings of alloy ABD-3 of nominal composition according to Table 4 were manufactured using conventional methods for producing single crystal components. The castings were in the form of cylindrical bars of 10 mm diameter and 160 mm in length. The cast bars were confirmed to be single crystals with an orientation within 10° from the <001> direction.

The as cast material was given a series of subsequent heat treatments in order to produce the required γ/γ' microstructure. A solution heat treatment was conducted at 1300° C. for 4 hours, this was found to remove residual microsegregation and eutectic mixtures. The heat treatment window for the alloy was found to be sufficient to avoid incipient melting during the solution heat treatment. Following the solution heat treatment the alloy was given a two stage ageing heat treatment, the first stage conducted at 1125° C. for 1 hour and the second stage conducted at 870° C. for 16 hours.

Creep specimens of 20 mm gauge length and 4 mm diameter were machined from fully heat-treated single crystal bars. The orientation of the test specimens were within 10° from the <001> direction. Test temperatures ranging from 800 to 1100° C. were used to evaluate the creep performance of the ABD-3 alloy. Cyclic oxidation tests were performed on the fully heat treated material. Cyclic oxidation tests were carried out at 1000° C. using 2 hours cycles over a time period of 50 hours.

Figure 11:
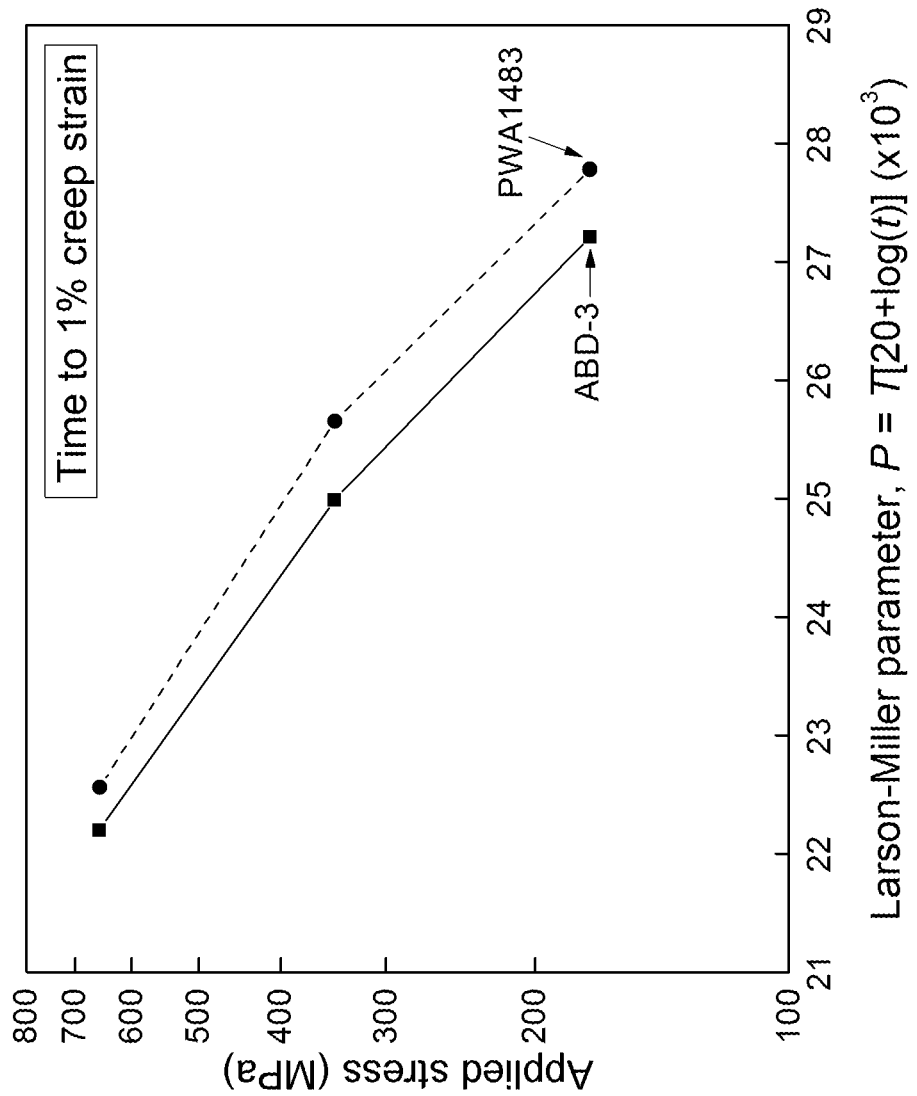
FIG. 11 shows the time to 1% creep strain for the newly designed alloy ABD-3 (squares) compared with 2nd generation single crystal turbine blade PWA1483 (circles)
Figure 12:
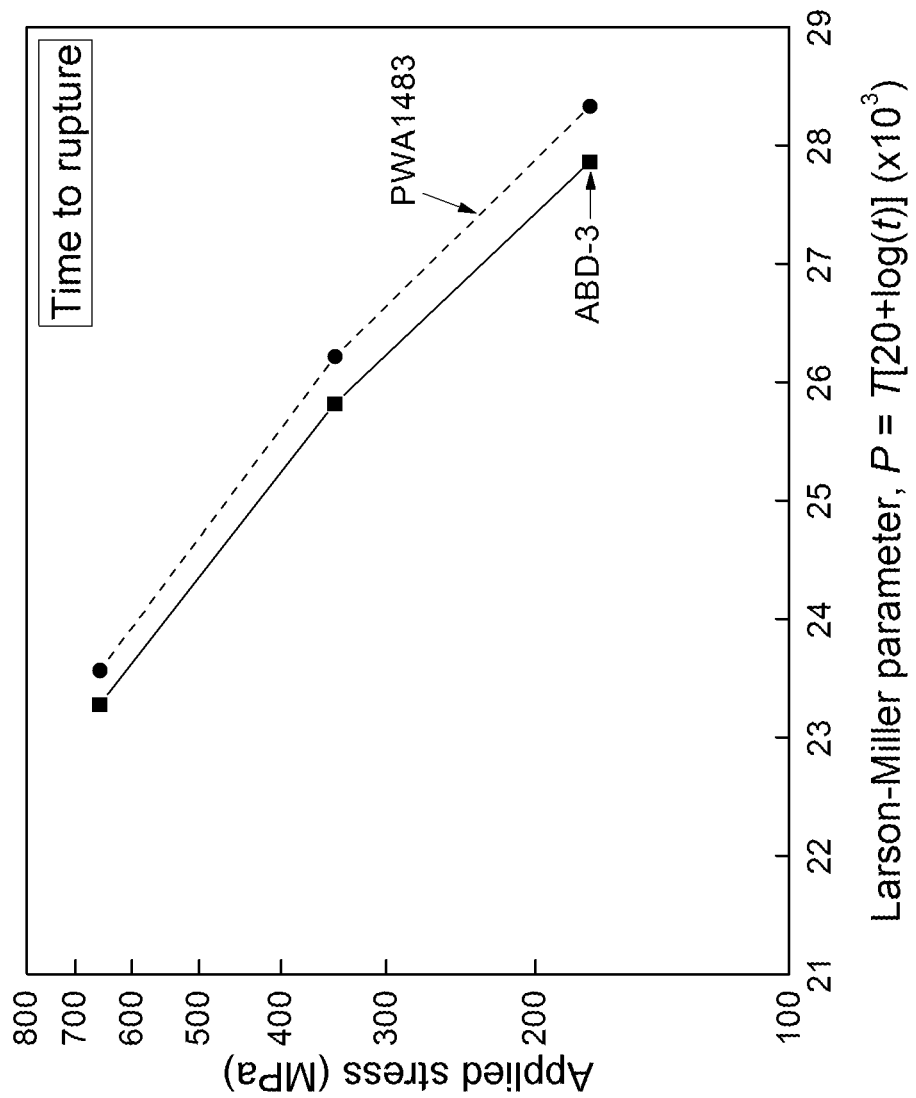
FIG. 12 shows the time to rupture for the newly designed alloy ABD-3 (squares) compared with 2nd generation single crystal turbine blade PWA1483 (circles)

A Larson-Miller diagram was used to compare the creep resistance of alloy ABD-3 with alloy PWA1483. In FIG. 11 a comparison of time to 1% creep strain is presented for both alloys. The time to 1% strain is critical as most gas turbine components are manufactured to tight tolerances to achieve maximum engine performance. After low levels of strain—in the order of a few percent—components will often be replaced. It is seen that alloy ABD-3 is comparable to PWA1483 in time to 1% creep strain. FIG. 12 shows a comparison of time to creep rupture for both alloys, it is seen that alloy ABD-3 has a rupture life comparable to that of PWA1483.

Figure 13:
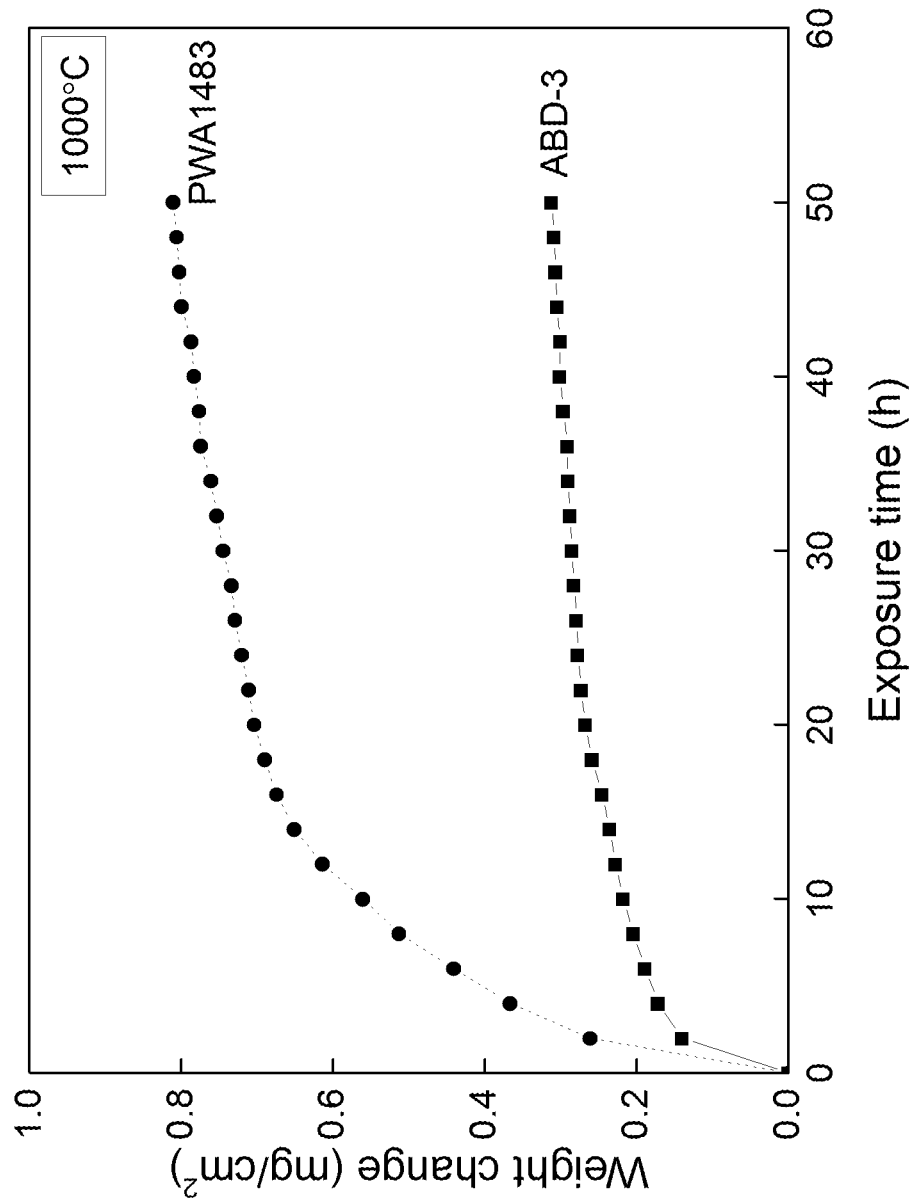
FIG. 13 shows the measured weight change for ABD-3 (squares) and PWA1483 (circles) when oxidised in air at 1000° C.

The oxidation behaviour of alloys ABD-3 and PWA1483 was also compared. As turbine temperatures continue to rise—improving thermal efficiency of the engine—component failure due to corrosion damage such as oxidation is becoming more prevalent. This damage mechanism is particularly relevant to IGT applications where fuels—which are not as clean as those used for aeroengine application—are used. Hence, significant gains in component life may be attained by improving oxidation/corrosion resistance. The alloy ABD-3 was designed such that it would have improved oxidation behaviour relative to current second generation alloys. Cyclic oxidation results for ABD-3 and PWA1483 are presented in FIG. 13. A reduction in mass gain with respect to time is evidence of improved oxidation behaviour as the formation of a protective oxide scale has occurred limiting the ingress of oxygen into the substrate material. The ABD-3 alloy shows significantly reduced weight gain with respect to time when compared to PWA1483, indicative of improved oxidation performance. This is thought to be as a result of the increased level of chromium in ABD-3 (13.00 wt %) compared to 12.20 wt % for PWA1483 and this is direct evidence of the improvement in oxidisation performance achieved by the high levels of chromium in the alloy of the invention.

Overall the alloy ABD-3 shows equivalent creep behaviour in comparison to PWA1483. This has been achieved using an alloy with a significantly improved oxidation behaviour. Thus design goals have been met whilst still achieving a low cost and density alloy which is amenable to conventional manufacturing techniques.

Examples of alloy compositions which have been isolated for a preferred balance of properties in comparison to ABD-3 are now described. The compositions of the alloys are presented in Table 5.

TABLE 5

Nominal composition in wt. % of the newly designed single crystal alloys ABD-3 along with the composition of a improved creep resistance (MC) and improved oxidation resistance (MO) variant.

| Name | Cr | Co | W | Al | Ta | Mo | Re | Hf | Ti | Si |
| --- | --- | --- | --- | --- | --- | --- | --- | --- | --- | --- |
| ABD-3      | 13.00 | 10.00 | 5.00 | 5.40 | 7.00 | 0.00 | 0.00 | 0.00 | 0.00 | 0.00 |
| ABD-3(MC)  | 12.50 | 10.50 | 5.40 | 5.70 | 7.00 | 0.25 | 0.20 | 0.00 | 0.25 | 0.00 |
| ABD-3(MO)  | 14.50 | 10.00 | 4.65 | 5.40 | 7.00 | 0.00 | 0.00 | 0.15 | 0.00 | 0.10 |

Alloy ABD-3(MC) is designed for improved creep resistance, this has been done at the expense of oxidation resistance and cost. Alloy ABD-3(MO) is designed for improved oxidation resistance, this has been done at the expense of creep resistance. The properties of the ABD-3 (MC) and ABD-3(MO) are compared with the nominal composition of alloy ABD-3 in Table 6. The design rationale for the ABD-3(MC) and ABD-3(MO) alloys is now described, the changes described are relative to the nominal composition of ABD-3.

TABLE 6

Calculated phase fractions and merit indices made with the "Alloys-by-Design" software. Results for the newly designed single crystal alloys ABD-3 along with the improved creep resistance (MC) and improved oxidation resistance (MO) variant listed in Table 5.

| Alloy | Phase Fractions | | | | | Creep Merit Index $(m^{-2}s \times 10^{-15})$ | Density $(g/cm^3)$ | Cost ($/lb) | $\gamma_{APB(111)}$ $(mJ/m^2)$ | $\gamma/\gamma'$ Misfit (%) |
|---|---|---|---|---|---|---|---|---|---|---|
| | $\gamma'$ | $\sigma$ | P | $\mu$ | $\sigma + P + \mu$ | | | | | |
| ABD-3 | 0.50 | 0.000 | 0.000 | 0.000 | 0.000 | 4.75 | 8.5 | 16.26 | 312 | 0.13 |
| ABD-3(MC) | 0.57 | 0.001 | 0.000 | 0.000 | 0.001 | 5.17 | 8.5 | 19.20 | 320 | −0.01 |
| ABD-3(MO) | 0.50 | 0.000 | 0.000 | 0.000 | 0.000 | 4.52 | 8.5 | 16.18 | 311 | 0.06 |

For the alloy ABD-3(MC) where improved creep resistance was required it was necessary to increase $\gamma'$ volume fraction, APB energy and creep merit index. The volume fraction of $\gamma'$ was increased from 50% to 57% by including a higher content of aluminium and also including some additions of titanium. Titanium was also beneficial as this increased the APB energy, which is known to increase the strength of the $\gamma'$ precipitate phase. In order to increase the creep merit index additional inclusions of tungsten, molybdenum and rhenium were made, this resulted in an increased creep merit index. The additions of rhenium have a strong effect on creep resistance but negatively influenced cost. The increases in creep resistance—made using the methods previously described—resulted in a reduction the chromium content so that the alloy remains substantially free from TCP phases. Thus, the creep resistance was improved still further but at the expense a slight reduction in oxidation resistance.

For the alloy ABD-3(MO) where improved oxidation resistance was required, an alloy composition with a higher chromium content was chosen. Additions of hafnium and silicon were also beneficial as these elements improve the adherence of the oxide scale. In combination with an increased level of chromium, lower levels of tungsten were used so that the alloy would remain substantially free from TCP phases. Even though the levels of tungsten selected are lower than for ABD-3, the creep merit index remains high so that good creep resistance is achieved. The balance of tungsten and chromium in the alloy is such that the alloy remain substantially free from TCP phases. Thus, the oxidation resistance was improved still further but at the expense of creep resistance.

The invention claimed is:

1. A nickel-based alloy composition consisting, in weight percent, of: between 12.3 and 15.2% chromium, between 4.8 and 12.0% cobalt, between 2.5 and 8.3% tungsten, between 0.0 and 0.5% molybdenum, between 0.0 and 0.5% rhenium, between 3.5 and 6.7% aluminium, between 6.1 and 10.7% tantalum, between 0.0 and up to 0.5% hafnium, between 0.0 and 0.5% niobium, between 0.0 and 0.5% titanium, between 0.0 and 0.5% vanadium, between 0.0 and 0.1% silicon, between 0.0 and 0.1% yttrium, between 0.0 and 0.1% lanthanum, between 0.0 and 0.1% cerium, between 0.0 and 0.003% sulphur, between 0.0 and 0.05% manganese, between 0.0 and 0.05% zirconium, between 0.0 and 0.005% boron, between 0.0 and 0.01% carbon, the balance being nickel and incidental impurities.

2. The nickel-based alloy composition according to claim 1, consisting, in weight percent, of between 12.3 and 14.7% chromium.

3. The nickel-based alloy composition according to claim 1, consisting, in weight percent, of between 7.1 and 11.0% cobalt.

4. The nickel-based alloy composition according to claim 1, consisting, in weight percent, of between 3.3 and 6.4% tungsten.

5. The nickel-based alloy composition according to claim 1, consisting, in weight percent, of, between 4.5 and 6.4% aluminium.

6. The nickel-based alloy composition according to claim 1, consisting, in weight percent, of between 6.5 and 10.7% tantalum.

7. The nickel-based alloy composition according to claim 1, consisting, in weight percent, of between 0.0 and 0.2% hafnium.

8. The nickel-based alloy composition according to claim 1, wherein the sum of the elements cobalt and tungsten, in weight percent, is greater than 13.5%.

9. The nickel-based alloy composition according to claim 1, wherein the sum of the elements cobalt, tungsten, rhenium and molybdenum, in weight percent, is greater than 13.5%.

10. The nickel-based alloy composition according to claim 1, wherein the sum of the elements tungsten and tantalum, in weight percent, is less than 14.4%.

11. The nickel-based alloy composition according to claim 1, wherein the sum of the elements aluminium and tantalum, in weight percent, is between 11.5 and 16.2%.

12. The nickel-based alloy composition according to claim 1, wherein the following equation is satisfied in which $W_{Ta}$ and $W_{Al}$ are the weight percent of tantalum and aluminium in the alloy respectively $$33 \leq W_{Ta} + 5.2 W_{Al} \leq 45.$$

13. The nickel-based alloy composition according to claim 1, wherein the following equation is satisfied in which $W_{Ta}$, $W_{Al}$, $W_{Ti}$, $W_{Nb}$ and $W_v$ are the weight percent of tantalum, aluminium, titanium, niobium and vanadium in the alloy respectively $$4.2 \leq (W_{Ta} + W_{Ti} + W_{Nb} + W_v) - 0.5 W_{Al}.$$

14. The nickel-based alloy composition according to claim 1, wherein the following equation is satisfied in which $W_W$, $W_{Mo}$, $W_{Re}$ and $W_{Co}$ are the weight percent of tungsten, molybdenum, rehenium and cobalt in the alloy respectively $$15.2 \leq [1.26(W_W + W_{Mo} + W_{Re})] + W_{Co}.$$

15. The nickel-based alloy composition according to claim 1, wherein the following equation is satisfied in which $W_{Ta}$ and $W_W$ are the weight percent of tantalum and tungsten in the alloy respectively $$12.7 \geq W_{Ta} + 0.87 W_W.$$

16. The nickel-based alloy composition according to claim 1, wherein the following equation is satisfied in which $W_{Cr}$ and $W_W$ are the weight percent of chromium and tungsten in the alloy respectively $$11.64 \geq W_{Cr} + 0.179 W_W^2 - 1.54 W_W.$$

17. The nickel-based alloy composition according to claim 1, wherein the sum of the elements rhenium, molybdenum and tungsten, in weight percent, is at least 2.5%.

18. The nickel-based alloy according to claim 1, wherein the sum of the elements niobium, titanium, vanadium and tantalum, in weight percent, is between 6.1 and 10.7%.

19. The nickel-based alloy according to claim 1, consisting, in weight percent, of at least 0.1% molybdenum.

20. A single crystal article formed of the nickel-based alloy composition of claim 1.

* * * * *

UNITED STATES PATENT AND TRADEMARK OFFICE
CERTIFICATE OF CORRECTION

PATENT NO. : 10,370,740 B2
APPLICATION NO. : 15/741700
DATED : August 6, 2019
INVENTOR(S) : Reed et al.

Page 1 of 1

It is certified that error appears in the above-identified patent and that said Letters Patent is hereby corrected as shown below:

In the Claims

In Claim 5, Column 18, Line 19, please delete "in weight percent of, between" and insert --in weight percent, of between-- therefore.

In Claim 18, Column 19, Line 9, please delete "nickel-based alloy" and insert --nickel-based alloy composition-- therefore.

In Claim 19, Column 19, Line 12, please delete "nickel-based alloy" and insert --nickel-based alloy composition-- therefore.

Signed and Sealed this
Third Day of March, 2020

Andrei Iancu
*Director of the United States Patent and Trademark Office*